United States Patent [19]

Rommel et al.

[11] Patent Number: 5,229,722
[45] Date of Patent: Jul. 20, 1993

[54] NQR-IMAGING

[75] Inventors: Eberhard Rommel, Ulm-Gögglingen; Peter Nickel, Ulm-Lehr; Rainer Kimmich; Daniel Pusiol, both of Ulm, all of Fed. Rep. of Germany

[73] Assignee: Broker Analytische Messtechnik GmbH, Rheinstelten, Fed. Rep. of Germany

[21] Appl. No.: 738,593

[22] Filed: Jul. 31, 1991

[30] Foreign Application Priority Data

Aug. 4, 1990 [DE] Fed. Rep. of Germany ....... 4024834

[51] Int. Cl.$^5$ .......................................... G01R 33/20
[52] U.S. Cl. ................................... 324/307; 324/315
[58] Field of Search ............. 324/300, 307, 309, 310, 324/311, 312, 313, 314, 318, 322; 128/653.2, 653.5

[56] References Cited

U.S. PATENT DOCUMENTS

| | | | |
|---|---|---|---|
| 3,643,181 | 2/1972 | Stirrat et al. | 324/300 |
| 3,711,764 | 1/1973 | Ernst | 324/312 |
| 3,725,773 | 4/1973 | Nelson | 324/310 |
| 4,450,407 | 5/1984 | Kwon et al. | 324/304 |
| 4,461,996 | 7/1984 | Kwon | 324/315 |
| 4,514,691 | 4/1985 | De Los Santos et al. | 324/301 |

OTHER PUBLICATIONS

Journal of Research, vol. 74C, pp. 3 to 8, Frisch et al., "Locked Nuclear Quadrupole Resonance Spectrometer for Pressure Measurements".
G-I-T Fachz. Lab., vol. 9, 1971, pp. 922 to 930, Fitzky: "Die Kernquadrupolresonanz, eine neue spektroskopische Methode zur Strukturaufklärung".
Journal of Magnetic Resonance, 88, 186-191 (1990), Matsui et al.: "An NQR Imaging Experiment on a Disordered Solid".
Journal of Magnetic Resonance, 33, 183-197 (1979), Hoult: "Rotating Frame Zeugmatography".

*Primary Examiner*—Michael J. Tokar
*Attorney, Agent, or Firm*—Cesari and McKenna

[57] ABSTRACT

In an imaging method for spectroscopy of nuclear quadrupole resonances (NQR) with solid samples to which an RF field having a pulse duration $t_p$ with a base amplitude $B_{10}$ constant over the sample length for magnetic excitation of NQR with resonance frequencies $\omega$ and with magnetic moments coupled to the nuclear quadrupole moments is applied and the NQR signal emitting from the sample is time-depentently detected, the RF field is superimposed by a position-dependent field contribution corresponding to a constant gradient $B_1^x$ which yields together with the constant RF field a position-dependent RF field $B_1(x)$, for each resonance frequency contained in the detected NQR signal the amplitude including its sign is determined, the measurements are carried out at different flip angles $\sqrt{3} \cdot \gamma \cdot B_1 (x) \cdot t_p$ of the excited magnetic moment, the amplitudes including their signs which depend on the flip angle are subjected to a Fourier transformation and finally therefrom the x dependent density distribution of the observed nuclei is reconstructed. The method does without applying of an external $B_0$ field, so that it can be carried out with a compacter measuring apparatus, in which the sample can also be situated partly outside. Effects of the Zeeman splitting do not have to be taken into consideration.

17 Claims, 3 Drawing Sheets

NQR-IMAGING

BACKGROUND OF THE INVENTION

The invention relates to an imaging method for spectroscopy of nuclear quadrupole resonances (NQR), especially with polycristalline, powdery solid samples whereby an RF field having a pulse duration $t_p$ with a base amplitude $B_{10}$ constant over the sample length for magnetic excitation of nuclear quadrupole resonances with resonance frequencies $\omega$ and of the magnetic moments coupled to the nuclear quadrupole moments is applied to the sample and whereby the NQR signal emitting from the sample is time-dependently detected.

Such a method is known from an article by Matsui et al. in Journal of Magnetic Resonance 88, 186–191 (1990).

Imaging methods for nuclear magnetic resonance spectroscopy have nowadays become a standard technique for the investigation of samples producing liquid-like signals. There is also progress in the development of methods for imaging of solid materials. The principles common to all these techniques is magnetic resonance expressed by the equation $$\omega = \gamma(B_0 + r \cdot G) \quad [1]$$

for the resonance or Larmor frequency $\omega \cdot \gamma$ is the gyromagnetic ratio, $B_0$ the external field of the magnet, and $r \cdot G$ the additional encoding field produced by the gradient coils.

The present invention relates to a method which is based on the second type of nuclear spin resonance, namely nuclear quadrupole resonance (NQR). The attempt to produce images with NQR signals using the normal magnetic field-gradient encoding procedure can lead to severe problems. One then has to consider Zeeman splittings in the weak-field limit. For nuclei with half-integer spins $I \geqq 3/2$, for instance, the zero-field NQR line in the axially symmetric case splits into at least four lines. The splitting depends on the magnetic flux density and the angle between the magnetic field and the electric field gradient. For non-vanishing asymmetry parameters the situation is even more complicated.

Although a linear relationship between $\omega$ and the magnetic field applied via the encoding gradients is still valid, the usual imaging procedures using phase-encoding fail, like eg. 2DFT-imaging procedures or projection/reconstruction procedures. The Zeeman splitting depends on the orientation of the electric field gradient against the magnetic field. The consequence is an inhomogeneous broadening depending on the magnetic field i.e. on the position. The lines of the quadrupole spectrum tend to overlap or their intensities become too weak to be detectable.

Conventional imaging techniques may only be useful with single crystals with a definite orientation. One applies a weak external magnetic field $B_0$ to the crystal and chooses the crystal orientation so that the lines are well separated from each other. A suitable line can then be used for encoding with gradients of $B_0$. Corresponding test experiments have been carried out successfully, but the circumstances under which this procedure is applicable are rather special and limited.

In the above cited publication by Matsui et al. a NQR imaging method is described in which by applying a homogenous magnetic field gradient a further broadening of the quadrupole lines proportionally to the local Zeeman field is produced. At zero field position the line width is at the minimum. The known position-dependence of the line width is then used for imaging in NQR measuring. A disadvantage of this method is that for producing a position-dependent Zeeman field an adequate magnet, normally a high-power radio-frequency (RF) magnetic coil, is necessary. Thereby the whole apparatus is doomed to be relatively big and bulky. Moreover, the sample to be examined has to be smaller than the device, since the sample has to be totally inside the Zeeman field. Another disadvantage of the method is that the position-dependence of the line widths in the magnetic field has to be determined by additional measurements. The recording duration of these additional measuring sequences can be compared with the recording duration of the signals for the actual image reconstruction.

SUMMARY OF THE INVENTION

Therefore it is an object of the present invention to provide a NQR imaging method of the kind mentioned above, which can be carried out on a more compact measuring apparatus in which the sample can also be partly outside the measuring arrangement, which does have considerably shorter recording times and in which no effects due to the Zeeman splitting have to be considered.

This object is solved in that the RF field is superimposed by a position-dependent field contribution, preferably varying linearly in a spatial direction x corresponding to a constant gradient $G_1^x$ which yields together with the constant RF field a position-dependent RF field $B_1(x)$, in that the amplitude including its sign is determined for each resonance frequency $\omega$ contained in the detected NQR signal, in that the measurements are carried out at different flip angles $\sqrt{3} \cdot \gamma \cdot B_1(x) \cdot t_p$ of the excited magnetic moment, in that the amplitude values including their signs which depend on the flip angle are subjected to a Fourier transformation and in that finally therefrom the x-dependent density distribution of the observed nuclei is reconstructed.

In contrast to the NMR imaging method, the NQR imaging method in accordance with the invention does without extern homogeneous magnetic fields, since in NQR the quantization direction is determined by the crystalline structure and the bonding circumstances. Moreover, the lines of the NQR substances often have a narrow line width which is advantageous in solid imaging. The method according to the invention does without static magnetic field gradients which in the case of solid materials must have considerable strength. The application of a radio-frequency gradient in the NQR zero field resonance method according to the invention permits the imaging of the position resolved density distribution of quadrupole nuclei.

From a publication by Hoult in Journal of Magnetic Resonance 33, 183–197 (1979) under the name of "Rotating Frame Zeugmatography" a NMR imaging method is known in which a liquid sample is subjected to an external homogenous magnetic field $B_0$ and by irradiation of a position dependent RF field with homogenous field contribution the protons in the liquid sample are excited to nuclear spin resonances. The flip angle of the magnetic moment in the sample depends on the position of the sample relative to the RF field. The NMR signal is read out layer-selectively when applying a readout gradient to the sample. In this method a big magnet for producing the homogenous magnetic field $B_0$ is needed by all means. This method does not provide for investigating solid materials and would theoretically be possible only with excessively great effort and with extreme bad resolution. Moreover, due to applying the readout gradient, all spectroscopic information, such as frequency changes due to changes in temperature and/or pressure or due to different isotopes, are completely lost.

In an advantageous embodiment of the method according to the invention the detected time-dependent NQR signal is subjected to a Fourier transformation in order to determine the amplitudes including their signs which depend on the resonance frequencies. The Fourier transformation usually permits a more convenient evaluation of signals with several frequency contributions. In the special case when only one resonance line exists in the signal, in a further embodiment of the method an integration of the amplitudes over the resonance frequencies can be carried out subsequent to the Fourier transformation of the time-dependent NQR signal. By summing up the frequency compounds of the resonance line an improvement of the signal-to-noise ratio is achieved.

In the special case mentioned, where only one resonance line exists in the signal, the nuclear density distribution is to be determined in the x-direction exclusively. In a further embodiment of the method in accordance with the invention, this can also be achieved without previous Fourier transformation reducing the calculating time needed for evaluation in that from the time-dependent NQR signal only the amplitude including its sign at a determined time of the measuring is taken to be further evaluated.

In a preferred embodiment of the method according to the invention the different flip angles $\sqrt{3} \cdot \gamma \cdot B_1(x) \cdot t_p$ are produced by variation of the pulse duration $t_p$. This particularly simple version of the NQR imaging method can be carried out on RF transmitters which are common in trade, without a linearly determinable amplitude being needed.

Alternatively, the different flip angles $\sqrt{3} \cdot \gamma \cdot B_1(x) \cdot t_p$ can be produced by variation of the gradient $G_1^x$ or by additional variation of the constant base amplitude $B_{10}$. In this case it is advantageous that the excitation bandwidth is not changed, which usually is the case when the pulse duration $t_p$ is varied because of the different frequency contributions of pulses with different durations.

The production of multi-dimensional NQR images according to the projection/reconstruction method is achieved in a preferred embodiment of the imaging method in accordance with the invention in that the measuring and evaluating steps are repeated at different angle positions of the sample relative to the direction of the applied RF gradient $G_1$. For doing so, only one single RF coil is necessary and the total pulse duration per scan, i.e. the time from the beginning of the first pulse to the beginning of the signal recording is shorter than in multi-dimensional methods with sequential irradiation of the RF gradient in different spatial directions.

In a further embodiment of this method the different angle positions of the sample relative to the direction of the applied RF gradient $G_1$ can be achieved by rotation of the sample. This only requires a device for mechanical rotation of the sample which, especially with small samples, can be a relatively simple apparatus. Another possibility would be the rotation of the corresponding gradient coil which, however, in most cases requires a comparatively greater effort with respect to the apparatus.

Alternatively in a further embodiment the different angle positions of the sample relative to the direction of the applied gradient $G_1$ can be achieved by rotation of the direction of the applied gradient $G_1$, especially by applying a sum gradient $G_1$ which is produced by superimposing of at least two differently directed gradients. Here, no mechanical rotation at all is necessary, but the rotation of the gradient is effected electronically, so to say.

In a further embodiment of the NQR imaging method according to the invention the RF field irradiated in x direction is sequentially superimposed by gradients $G_1^x$, $G_1^y$, $G_1^z$ which are directed into different, preferably orthogonal spatial directions. This version of the method also permits multi-dimensional imaging by using a multi-dimensional Fourier transformation. Here, the calculating method is simpler than in the above described projection/reconstruction method, which can be decisive especially in mobil devices with compacter minicomputers. Moreover, in this version of the method, the same image focus can be achieved all over the image, whereas in the versions described further above less focus and less contrast have to be accepted in the margin portions.

Magnetic coils, which produce constant gradient fields all over the effective area, are hard to achieve due to geometrical effects. Therefore in an embodiment of the invention the applied gradients $G_1$ can vary in the known way over the respective gradient direction. The known position-dependent version of the applied gradient or gradients $G_1$ can be deconvoluted from the measured signals in the evaluation. Thereby the use of simpler and cheaper coil constructions is possible, especially the use of surface coils, the advantages of which will be described further below.

In a most preferred embodiment of the imaging method according to the invention position-dependent changes of the resonance frequencies $\omega$, which eg. result from the effect of physical quantities such as temperature, pressure, mechanical stress and electric voltage on the crystalline field of the observed nuclei, can be reconstructed from the density distribution of the observed nuclei for the different resonance frequencies $\omega$. Thus direct measurements of the mentioned perturbation quantities as well as their gradients in the solid-state body are possible by applying the NQR imaging method in accordance with the invention. Contamination of the observed solid-state body in the form of foreign atoms, which change the resonance frequency of the observed nuclei and so displace the resonance lines, can thus also be detected. Especially in the embodiment of the apparatus described below and by application of the surface coils the method according to the invention can thus be used as indirect measuring method for mobil measurements of the corresponding physical perturbation quantities.

The invention also comprises an apparatus for carrying out the method in accordance with the invention having at least one RF transmitter coil arrangement for irradiation of an alternating magnetic field $B_1$ in x direction with superimposed gradient $G_1$ in a solid sample for excitation of nuclear quadrupole resonances in the sample and with a thereto coaxial receiver coil arrangement for detection of the nuclear induction signal emitting from the sample, whereby the receiver coil arrangement is RF-decoupled from the transmitter coil arrangement.

On the one hand, due to the decoupling the receiver coil arrangement does not perturbate the irradiated RF field and on the other hand the overdrive of the receiver electronics is avoided due to the relative strong transmitting pulse.

In a particularly simple embodiment of the arrangement in accordance with the invention the RF transmitter coil arrangement is an anti-Helmholtz arrangement and the receiver coil arrangement is a solenoid coil.

In a preferred embodiment the RF transmitter coil arrangement is an anti-Helmholtz arrangement, whereby the sample is arranged coaxially, but asymmetrically between the two coil parts of the anti-Helmholtz arrangement and the receiver coil arrangement consists of an at least two-part air coil arrangement, one part of the air coil surrounding coaxially the sample and its other part being also arranged coaxially to the anti-Helmholtz arrangement within the anti-Helmholtz in axial distance to the sample in such a way that it just compensates the field produced by the anti-Helmholtz arrangement in the part of the receiver coil arrangement surrounding the sample. Thus a considerably greater filling factor as well as a greater noise reduction than in simpler embodiments with a solenoid coil as receiver coil arrangement is achieved. Especially the part of the receiver coil arrangement surrounding the sample can have considerably more windings than the compensation part which in turn is placed nearer to the corresponding end of the anti-Helmholtz arrangement.

Finally, in a most preferred embodiment of the arrangement in accordance with the invention a surface coil is provided to serve both as an RF transmitter coil arrangement for irradiating an alternating magnetic field $B_1$ in x-direction with superimposed gradient $G_1$ into a solid sample for excitation of nuclear quadrupole resonances in the sample and at the same time also as a receiver coil arrangement for detecting the nuclear induction signal emitting from the sample. It is not possible that the transmitter and receiver coil arrangement perturbate each other, because only one single coil is used. An overdrive of the receiver electronics during the recording of a signal emitting from the sample can be subdued by electronic measures. With this embodiment a particularly compact and simple NQR measuring device is provided which is also especially suitable for local measurements of samples which are considerably bigger than the measuring arrangement itself. Because of the compact design of the arrangement mobile use of the device is also possible.

In the following, the invention is described more detailed with reference to the embodiments shown in the drawings. The features shown in the description and in the drawings may be used in other embodiments of the invention individually, or in any combination thereof.

DESCRIPTION OF THE PREFERRED EMBODIMENTS

Figure 1A:
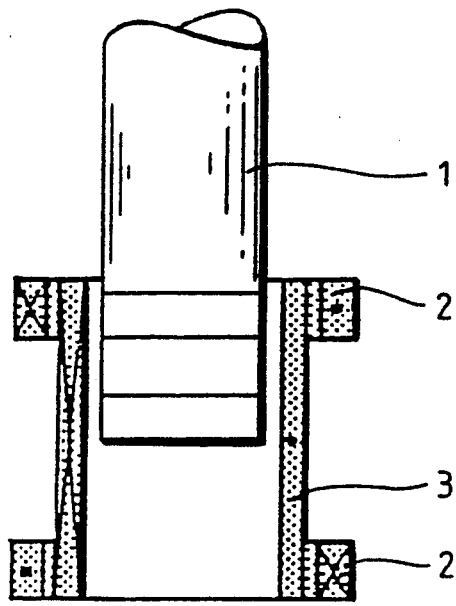
FIG. 1 shows a schematic longitudinal section of the sample and the RF coil arrangement whereby the transmitter coil arrangement is realized by an anti-Helmholtz configuration and the receiver coil arrangement by
a) a solenoid coil or
b) a two-part air coil arrangement.

The method in accordance with the invention is based exclusively on the excitation of nuclear quadrupole resonances so that no Zeeman splitting effects have to be taken into account at all. Zero-field NQR is of particular interest with half-integer spins because then even asymmetric electric field gradients do not complicate the spectra by lifting the degeneracy of the eigenstates. The simplest spectra are obtained with the spin I=3/2 nuclei which provide singlet lines. There may be a distribution of isotopes with different electric quadrupole moments, and the electric field gradients normally differ in different compounds or crystal lattice sites. Spectroscopic resolution, i.e. for instance in the frequency domain in addition to merely spatial resolution therefore is desirable in any case.

Like the above cited "Rotating Frame Zeugmatography" known from the NMR imaging, the method of the present invention is also based on a flip-angle encoding technique. Non-uniform radio frequency (RF) fields are applied so that the flip angle of an RF pulse depends on the position with respect to the RF field gradients. The RF coils are designed to produce preferably constant field gradients. In the original version of "Rotating Frame Zeugmatography" which was supposed to be applied only to NMR spectroscopy it was suggested to encode spatial information either in the amplitudes or the phases of the transverse magnetization producing the free-induction signal. The phase-encoding variant requires an additional and non-selective 90° RF pulse 90° degrees out of phase to the variable flip angle pulses. With NQR, phase encoding is not feasible because the transverse magnetization oscillates rather than precesses. The following therefore refers solely to the amplitude encoding variant.

The magnetization excited by an RF pulse under NQR conditions is aligned along the axis of the RF coil. Let this axis be the x axis of the laboratory frame. Moreover, assume spins I=3/2 and Gaussian resonance lines at $\omega=\omega_j$. The transverse magnetization which induces the free-induction decay (FID) can then be written in the form $$M(t, t_p) = \qquad [2]$$

$$\sum_j \frac{\sqrt{3}\ \omega_j\ ^2\gamma}{4k_BT} \exp\left(-\frac{\delta_j^2 t^2}{2}\right) \int_{-\infty}^{\infty} \rho_j(x)\cos(\omega_j t)\sin[\xi(x)]dx$$

with $$\xi(x) = \sqrt{3}\ \omega_1(x)t_p \qquad [3]$$

and $$\omega_1(x) = \gamma B_1(x) \quad [4]$$

$B_1$, half of the amplitude of the RF flux density; $\rho_j$, number density of nuclei with the resonance frequency $\omega_j$; h, Planck's constant; $\gamma$, gyromagnetic ratio; $k_B$, Boltzmann's constant; T, absolute temperature; $\delta_j$, second moment of the $j^{th}$ resonance line. The angle $\xi$ corresponds to the "flip angle" in NMR rotating frame zeugmatography.

Amplitude encoding by flip angle variation modulates the magnetization reached after the RF pulse duration $t_p$. The RF field $B_1(x)$ may be analyzed in a uniform contribution $B_{10}$ and a contribution from the RF gradient $G_1$. Analogous to eqn. [1], we have $$\omega_1(x) = \gamma B_1(x) = \gamma \left[ B_{10} + \int_0^x G_1(x') \cdot dx' \right] \quad [5]$$

If the gradient $G_1$ is constant and aligned along the x direction, the corresponding "k space" component is $$k_x = \sqrt{3} \, \gamma G_1 t_p \quad [6]$$

Carrying out the Fourier cosine transformation with respect to t provides the spectrum $S(\omega, t_p)$ for a given pulse length $t_p$ $$S(\omega, t_p) = \sum_j \sqrt{\frac{6\pi}{\delta_j}} \frac{\omega_j^2 \gamma}{4 k_B T} \exp\left( -\frac{(\omega - \omega_j)^2}{2\delta_j} \right) \int_{-\infty}^{\infty} \rho_j(x) \sin[\xi(x)] dx \quad [7]$$

If the gradient $G_1$ is constant, a second Fourier transformation concerning the variable $k_x$ is possible. It yields the projections of the object on the x direction for each resonance line $\omega_j$. This is suitably done after integration over the selected line leading to the integral line intensity $S_j^{int}(t_p)$.

Practically it may however be difficult to provide constant gradients so that one is rather dealing with a function $G_1 = G_1(x)$. Only the vector direction of $G_1$ may be assumed to be constant. In this generalized case the second Fourier transform is carried out with respect to the variable $t_p$. That is $$\int_{-\infty}^{\infty} S_j^{int}(t_p) e^{iut_p} dt_p \quad [8]$$

$$= \int_{u(-\infty)}^{u(\infty)} \left\{ \rho_j(x) \int_{-\infty}^{\infty} [\sin(\sqrt{3} \, \gamma B_1 t_p) e^{iut_p} dt_p] \frac{dx}{du} \right\} du$$

$$= \rho_j(x) \frac{dx}{d(\sqrt{3} \, \gamma B_1)}$$

One thus obtains $$\rho_j(x) = \sqrt{3} \, \gamma \frac{dB_1}{dx} \int_{-\infty}^{\infty} S_j^{int}(t_p) e^{i\sqrt{3} \, \gamma B_1 t_p} dt_p \quad [9]$$

This is the desired profile along the x axis. The spatial resolution is determined by the number of steps incrementing the pulse duration $t_p$.

Up to now only one space dimension has been considered. In his original proposal, Hoult suggested the subsequent application of a second RF pulse with a gradient in y direction of the laboratory frame. Signals depending on the k space components $k_x$ and $k_y$ thus could be recorded, so that the corresponding two-dimensional Fourier transform would directly provide a two-dimensional image. We point out that the use of a readout $B_0$ gradient to encode a further spatial direction is not under discussion in this context. The proposed method, however, would require a complex probe design which is difficult to realize.

The NQR methods, however, are restricted to solid samples, and there is a much simpler way to get access to the other spatial direction, namely the projection/reconstruction procedure. A set of projections on directions varied by small angles step by step is produced by rotating the object relative to the direction of the RF gradient. At each step a method taken from the rotating frame zeugmatography procedure is performed as described above. The increment angle is another quantity determining the spatial resolution. The reconstruction of an image from the recorded data sets is then a standard procedure.

In a first test experiment profile images across sandwich samples of $HgCl_2$ powder with polytetrafluoroethylene (PTFE) spacers were recorded. $HgCl_2$ had a purity specification of 99.999%. The spectrometer was tuned to $^{35}Cl$ NQR. The isotope $^{35}Cl$ has a spin I32 3/2 and a natural abundance of 75.5%. In $HgCl_2$ crystals, the two $^{35}Cl$ atoms are located at different lattice sites and therefore have different NQR frequencies of 22.230 MHz and 22.050 MHz at 30° C. It is important that heating of the samples by irradiation of the RF is avoided carefully, because the resonance frequencies are strongly temperature dependent.

The NQR spectrometer implied the following commercial components: modulator and 1.1 kW transmitter (Bruker SXP), synthesizer (PTS 500), preamplifier (Doty LN-2M) supplemented by three serial amplifiers (Avantek GPD 404), personal computer (HP RS/25C), pulse programmer board (SMIS PP2000), bus system (National Instruments GPIB-PC), active filter (Rockland 442), digital oscilloscope (Tektronix 2220). Quad-receiver, probehead and spectrometer software were home-made. Quarter- and half-wave lines with back-to-back diode arrangements were used in the transmitter/probehead system.

The RF gradients were produced by the aid of an anti-Helmholtz coil 2 (FIG. 1). The distribution of $B_1$ fields is given by $$B_1(x) = \frac{\mu_0 I}{2} \left[ \frac{R^2}{\{R^2 + (x + x_0)^2\}^{3/2}} - \frac{R^2}{\{R^2 + (x - x_0)^2\}^{3/2}} \right] \quad [10]$$

R, radius of the coils; $x_0=3R/2$, half of the distance between the coils; I, half amplitude of the current through the coils; $\mu_0$, magnetic field constant.

Figure 1B:
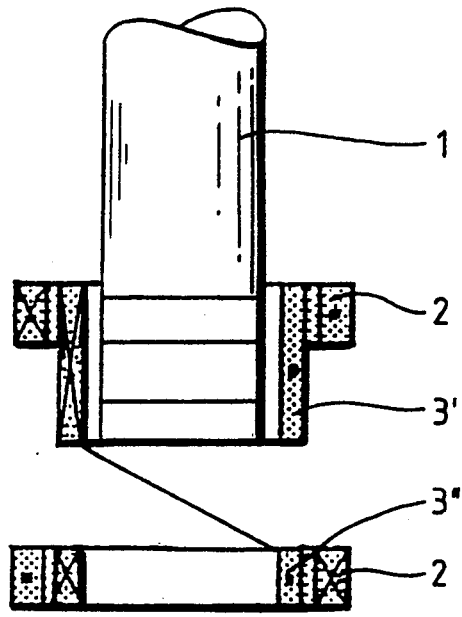

The sample 1 in FIG. 1 is placed in one half of the coil arrangement. In FIG. 1a, the receiver coil arrangement is a solenoid coil 3 coaxial to the anti-Helmholtz coils 2 of the transmitter coil arrangement. In order to improve the filling factor of the receiver coil arrangement, it can, as shown in FIG. 1b, also consist of two or more air coil parts, whereby an air coil part 3' surrounds the sample and another air coil part 3" in the vicinity of the part of the anti-Helmholtz arrangement which is turned away from the sample is provided for field compensation. The two air coil parts 3' and 3" are electrically connected in such a way that in the two coil parts the current flows in the same sense around the coil axis. The sample in the shown experiment has a diameter of 8.5 mm, the anti-Helmholtz configuration 2 has a diameter of 20 mm, a coil distance of 17.3 mm and a number of windings $2\times 8$. The solenoid coil 3 in FIG. 3a has a diameter of 14.5 mm, a length of 21 mm and 25 windings.

In this context it should be reminded that NQR principally cannot be carried out with crossed transmitter and receiver coil arrangements. On the other hand, a system of an anti-Helmholtz coils 2 and a symmetrically arranged solenoid coil 3 is decoupled per se and leads to an equivalent effect as electrically orthogonal coils. The air coil parts 3' and 3" of the receiver coil arrangement in FIG. 1b can also be chosen in such a way that they are decoupled from transmitter coils.

The duration of a 90° pulse at the position with the highest $B_1$ field was measured with a probe sample to be about 32 $\mu$s. The increment interval $\Delta t_p$ of the RF pulse duration was chosen to be 8 $\mu$s. Higher values led to excessively long pulses so that their bandwidth was not sufficient anymore.

1 k data points of each FID were recorded. After the Fourier transformation, one of the $^{35}$Cl lines was selected as the basis of the profile image. The data set of the rotating frame pseudo-FID in the $k_x$ or $t_p$ domain was formed by taking the integrals of the line recorded with varying flip angles. After appropriate filtering, baseline correction and apodisation, a second Fourier transformation was carried out with respect to $t_p$. The desired profile of the object is obtained according to eqn. [9] by the aid of the RF field profile according to eqn. [10].

Figure 2A:
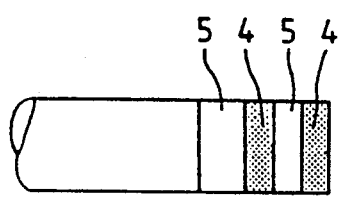
FIG. 2 shows a schematic cross section of a test object
b) a pulse duration dependent NQR signal amplitude curve of $^{35}Cl$ from a $HgCl_2$ sample
c) an x-density profile reconstructed by applying a constant $G_1$ gradient of b) with corresponding mirror image
d) a profile of c) corrected in view of deviations of the spatial constance of the gradient.
Figure 2B:
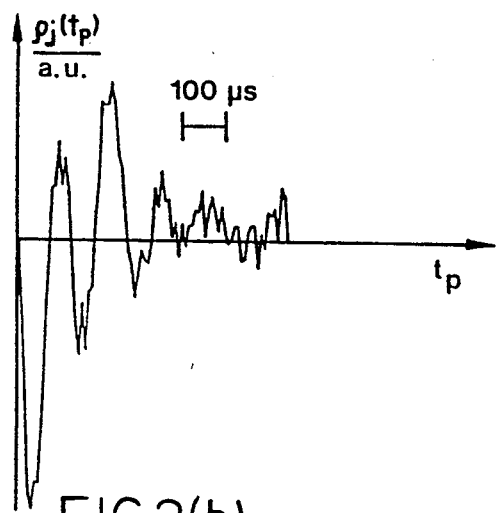
Figure 2C:
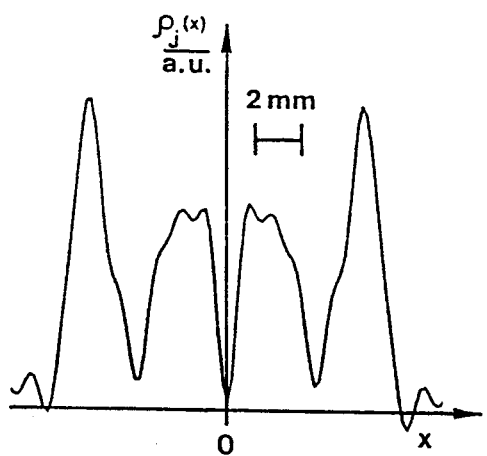
Figure 2D:
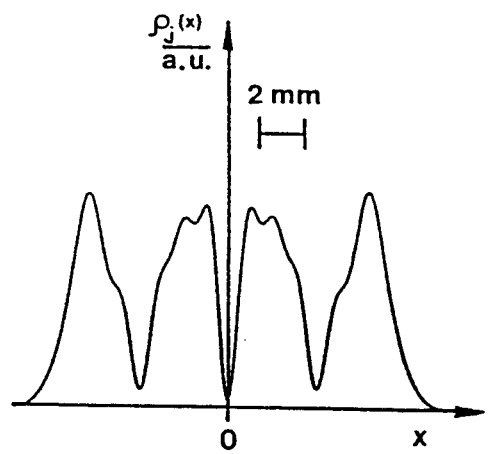

FIG. 2a shows a schematic cross section of an HgCl$_2$ object with HgCl$_2$ sections 4 and PFTE spacers 5. The corresponding NQR signal amplitude as function of the pulse duration $t_p$ is shown in FIG. 2b. FIG. 2c shows, assuming a constant gradient $T_1$, a reconstructed X-profile as well as the corresponding mirror profile. FIG. 2d shows a reconstructed profile as in FIG. 2c, which however is corrected in view of the deviations from a constant gradient $G_1$. This profile is reconstructed by inserting eqn. [10] in eqn. [9].

Note that the technique described above provides profiles mirrored at the center of the anti-Helmholtz coil. Therefore only one half of the profiles is real. The edges of the profiles are somewhat smoother than expected from the real object. This is due to the limitation of the maximum flip angle restricting the number of increments. The structure of the object is nevertheless clearly represented. The special probe and sample configuration used in the described experiment did not permit to record profiles in varying directions incremented by mechanical rotation of the object, the result nevertheless demonstrates the applicability of NQR for imaging purposes in principle.

Figure 3:
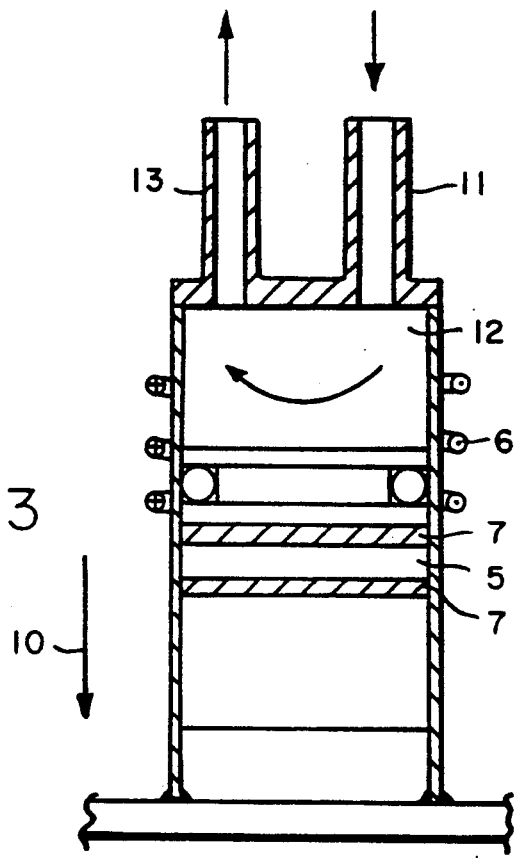
FIG. 3 a vertical section of a NQR measuring arrangement for temperature measurement.

For a second series of test experiments one single annular surface coil 6 with a diameter of 16 mm was used instead of the anti-Helmholz coil arrangement 2 as transmitter coil and of the solenoid coil 3 or 3', 3" as receiver coil, as shown in FIG. 3 in a schematic vertical section. It produces a position-dependent RF field in direction of its axis of symmetry which can easily be calculated just like the one of the anti-Helmholtz arrangement 2. Yet it additionally offers the possibility to perform local measurements of samples which are bigger than the coil arrangement.

The necessary decoupling of the receiver electronics from the transmitter electronics was realized by the aid of a conduit between probehead and receiver which is exactly tuned to a quarter of the RF wave length.

In this case As$_2$O$_3$ powder was observed as testing substance whereby the quadrupole resonance line of Arsenic at 116.2 MHz was used.

The sample configuration consisted of two layers 7 of As$_2$O$_3$ powder with a width of 0.8 mm and with a distance of 2 mm fixed by a teflon spacer 5 (FIG. 3). The upper end of the sample configuration was cooled to 6° C. by a liquid cooling design consisting of a refrigerant inflow 11, a cooling bath 12, a refrigerant discharge 13 and a seal 14, the lower end of the configuration had room temperature (about 20° C). The arrow 10 shows the direction of the corresponding temperature gradient.

The layers 7 as well as the teflon spacer 5 had a diameter of 13.7 mm, the layers 7 a width of 0.8 mm each and the teflon spacer 5 a width of 2 mm.

Figure 4:
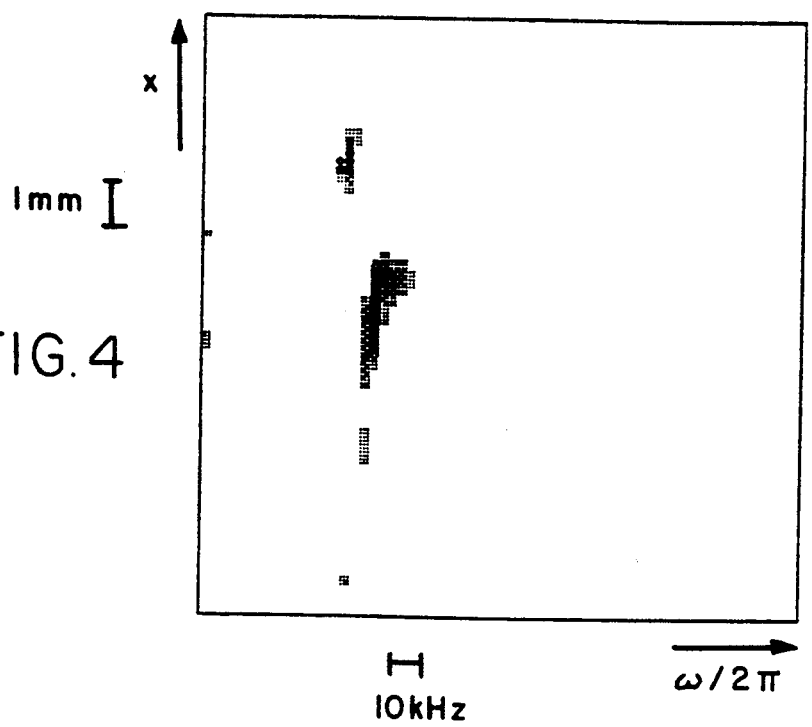
FIG. 4 a two-dimensional view of As nuclei density of the sample according to FIG. 3.

The NQR imaging experiment was carried out analogous to the one described before. The only difference was that now not only one single frequency point, but for each frequency point in the resonance spectrum an own profile was reconstructed. Thus, on the whole, by a two-dimensional Fourier transformation a two-dimensional image was calculated which shows in vertical direction the position-dependent and in the horizontal direction the frequency and thus in this case the temperature-dependent density distribution of the Arsenic nuclei. FIG. 4 shows clearly that the two sample parts have a different resonance frequency corresponding to a different temperature. As step width for the pulse duration $t_p$ 3 $\mu$s were used, 64 steps were performed. The duration of a 90° C. pulse for a sample within the coil was about 4 $\mu$s. The spatial resolution is 0.5 mm, the frequency resolution is 4 kHz corresponding to a temperature interval of 1.4° C.

This experiment shows that the suggested method eg. for measurement of temperature profiles is also suitable for big "samples" such as technical devices and/or their walls, whereby either the quadrupole nuclei can already be contained in the material of the objects to be examined or a suitable, eg. pin-like sensor probe can be introduced into the object to be examined.

The combination of "rotating frame zeugmatography" techniques with zero-field NQR methods permits the record of images analogous to the NMR case. The increment of the orientation angle of the object by mechanical rotation and the projection/reconstruction procedure do not require complex probe designs. It suffices to produce an RF gradient in one direction only. With multiple coil configurations for the production of RF gradients in two or even tree spatial directions, 2DFT- or 3DFT-imaging procedures are feasible.

NQR imaging refers to solid objects where quadrupole splitting is not quenched by rapid reorientations. Nevertheless the technique is not susceptible to the disadvantages of solid-state NMR imaging: Because the direction of quantization is given by the molecular or crystal frame rather than by the direction of an externally applied field, the resonance lines are relatively narrow (3 to 5 kHz in the present case), and they are reasonably well resolved.

As with NMR tomography, the technique described above is suitable to produce spin density ("$\rho$") images. Modifications of the procedure leading to images more or less weighted by the relaxation times are also possible. In addition, the present NQR imaging method additionally implies the full spectroscopic information, i.e. eg. the information from the frequency domain in addition to the mere spatial resolution, because no readout gradient is applied. In the method according to the invention it is not only possible to image the intensities of selected resonance lines of different compounds or molecular environments, but one can make use of the spectroscopic dimension and thus also image line shifts. Therefore, the NQR imaging in accordance with the invention is also sensitive to pressure, stress and temperature as well as gradients or generally any functions of these parameters.

We claim:

1. In a method for imaging a solid sample having a predetermined length and containing nuclear quadrupole moments in which a first pulsed radio-frequency field with a pulse duration $t_p$ and a base amplitude $B_{10}$ constant over the sample length is applied to the sample for exciting nuclear quadrupole moments to produce resonance signals with resonance frequencies $\omega$ and detecting the nuclear quadrupole resonance signals over a predetermined period of time, the improvement comprising the steps of:
    A. superimposing a second pulsed radio-frequency field over the first pulsed radio-frequency field, the second radio-frequency field having an amplitude varying linearly in a predetermined spatial direction so that the overall radio-frequency field is a position-dependent radio-frequency field $B_1(x)$:
    B. adjusting the first pulsed radio-frequency field and the second radio-frequency field to flip the excited nuclear quadrupole moments through a predetermined angle;
    C. making a measurment of the amplitude value of a nuclear quadrupole signal generated by the excited nuclear moments over the predetermined period of time;
    D. changing the predetermined angle in step B and repeating steps A through C a predetermined number of times;
    E. performing at least one Fourier transformation on the amplitude values measured in step C;
    F. reconstructing a density distribution of observed nuclei along the predetermined spatial direction from the transformed results of step E.

2. In an imaging method, the improvement according to claim 1, wherein step E comprises the step of:
    E1. performing a Fourier transformation with respect to time on the amplitude values measured in step C.

3. In an imaging method, the improvement according to claim 2, wherein step E further comprises the step of:
    E2. integrating the amplitude values over the resonance frequencies.

4. In an imaging method, the improvemetn according to claim 1, wherein step C comprises the step of:
    C1. selecting a single amplitude value from the amplitude value measured over time for further processing.

5. In an imaging method, the improvement according to claim 1, wherein step D comprises the step of:
    D1. changing the pulse duration $t_p$ in order to change the predetermined angle in step B.

6. In an imaging method, the improvement according to claim 1, wherein area D comprises the step of:
    D2. changing the amplitude variation of the second radio-frequency field in the predetermined direction in order to change the predetermined angle in step B.

7. In an imaging method, the improvement according to claim 1, wherein step D comprises the step of:
    D3. varying the amplitude of the first pulsed radio-frequency field in order to change the predetermined angle in step B.

8. In an imaging method, the improvement according to claim 1 wherein step D further comrpises the step of:
    D4. changing the angle of the sample relative to the predetermined spatial direction between measurements.

9. In an imaging method, the improvement according to claim 8 wherein step D4 comprises the step of:
    D4A. rotating the sample between measurements to change the angle of the sample relative to the predetermined spatial direction.

10. In an imaging method, the improvemetn according to claim 8, wherein step D4 comprises the step of:
    D4B. changing the second pulsed radio-frequency field to rotate the predetermined spatial direction between measurements to change the angle of the sample relative to the predetermined spatial direction.

11. In an imaging method, the improvement according to claim 10, wherein step D4B comprises the steps of:
    D4B'. applying a first pulsed radio-frequency field component having a first field gradient direction to the sample; and
    D4B''. applying a second pulsed radio-frequency field component having a second field gradient direction to the sample to generate a composite pulsed radio-frequency field having a sum gradient which rotates.

12. In an imaging method, the improvement according to claim 1 further comprising the steps of:
    G. superimposing a third pulsed radio-frequency field over the first pulsed radio-frequency field, the third radio-frequency field having an amplitude varying in a second predetermined spatial direction different from the first predetermined spatial direction; and
    H. repeating steps A through F in order to reconstruct a density distribution of observed nuclei along the second predetermined spatial direction.

13. In an imaging method, the improvement according to claim 12 wherein the third pulsed radio-frequency field has an amplitude varying linearly in the second predetermined spatial direction.

14. Apparatus for imaging a solid sample by means of nuclear quadrupole resonance signals, said apparatus comprising:
    at least one radio-frequency transmitter coil having an axis and being disposed about the sample;

a radio-frequency generator connected to the transmitter coil for generating an alternating magnetic field in the transmitter coil, the magnetic field having a superimposed gradient in at least one predetermined direction; and a receiver coil positioned coaxial with the transmitter coil axis and radio-frequency decoupled from the transmitter coil for detection of a nuclear induction signal emitted from the sample.

15. Apparatus for imaging according to claim 14 wherein the radio-frequency transmitter coil comprises a pair of coils connected in an anti-Helmholtz arrangement and the receiver coil comprises a solenoid coil.

16. Apparatus for imaging according to claim 15 wherein the radio-frequency transmitter coil comprises a first transmitter coil and a second transmitter coil connected in an anti-Helmholtz arrangement and wherein means is provided for positioning the sample coaxially and axially asymmetrically between the first and second transmitter coils and the receiver coil comprises an air coil having a first part coaxially surrounding the sample and a second part positioned coaxially with respect to the first and second transmitter coils and located axially with respect to the sample so that a field produced by the second air coil part compensates a field produced by the first and second transmitter coils in the first air coil part.

17. Apparatus for imaging a solid sample by means of nuclear quadrupole resonance signals, said apparatus comprising:

a radio-frequency surface coil;

a radio-frequency generator connected to the surface coil for generating an alternating magnetic field in the surface coil using the surface coil as a transmitter coil, the magnetic field having a superimposed gradient in at least one predetermined direction;

a detector for a nuclear induction signal emitted from the sample; and means for connecting the surface coil to the detector to use the surface coil as a receiver coil.

* * * * *

UNITED STATES PATENT AND TRADEMARK OFFICE
CERTIFICATE OF CORRECTION

PATENT NO.  : 5,229,722
DATED       : 07/20/93
INVENTOR(S) : Eberhard Rommel et al It is certified that error appears in the above-indentified patent and that said Letters Patent is hereby corrected as shown below:

On the Title page, item [73] Assignee:

Replace the word "BROKER" to --BRUKER--.

Signed and Sealed this

Twenty-third Day of August, 1994

Attest:

BRUCE LEHMAN

Attesting Officer      Commissioner of Patents and Trademarks